United States Patent [19]
Uram et al.

[11] Patent Number: 5,770,469
[45] Date of Patent: Jun. 23, 1998

[54] METHOD FOR FORMING SEMICONDUCTOR STRUCTURE USING MODULATION DOPED SILICATE GLASSES

[75] Inventors: Kevin J. Uram, Union City; John K. Shugrue; Nathan P. Sandler, both of Fremont, all of Calif.; Son Van Nguyen, Hopewell Junction; Matthias Ilg, Fishkill, both of N.Y.

[73] Assignee: Lam Research Corporation, Fremont, Calif.

[21] Appl. No.: 578,165

[22] Filed: Dec. 29, 1995

[51] Int. Cl.⁶ ................................................ H01L 21/316
[52] U.S. Cl. ........................ 437/240; 437/240; 437/982
[58] Field of Search .................................. 437/240, 982, 437/236

[56] References Cited

U.S. PATENT DOCUMENTS

| | | | |
|---|---|---|---|
| 4,217,375 | 8/1980 | Adams | 437/240 |
| 4,972,251 | 11/1990 | Lehrer | 357/54 |
| 5,104,482 | 4/1992 | Monkowski et al. | 437/982 |
| 5,231,046 | 7/1993 | Tasaka | 437/67 |
| 5,268,333 | 12/1993 | Lee et al. | 437/235 |
| 5,278,103 | 1/1994 | Mallon et al. | 437/240 |
| 5,286,681 | 2/1994 | Maeda et al. | 437/982 |

FOREIGN PATENT DOCUMENTS

| | | | |
|---|---|---|---|
| PCT/US90/ 01036 | 7/1990 | European Pat. Off. | H01L 21/311 |
| 657 925 A1 | 6/1995 | European Pat. Off. | H01L 21/768 |
| 58-137233 | 8/1983 | Japan | 437/240 |
| 61-095556 | 5/1986 | Japan | 437/982 |
| 61-237448 | 10/1986 | Japan | 437/982 |
| 62-123725 | 6/1987 | Japan | 437/240 |
| 63-192239 | 8/1988 | Japan | 437/240 |
| 63-289842 | 11/1988 | Japan | 437/240 |

OTHER PUBLICATIONS

Wolf, Stanley, "Sihcon Processing For the VLSI ERA", vol. 2, pp. 188–199 (1990).

Unknown, "Patent Abstracts of Japan," vol. 012, No. 481 (E–694), Dec. 15, 1988, JP 63 198359, Fujitsu, Ltd., Aug. 17, 1988.

Unknown, "Patent Abstracts of Japan," vol. 012, No. 106 (E–596), Apr. 6, 1988. JP 62 235739 (Matsushita Electronics Corp.), Oct. 15, 1987.

Unknown, "Patent Abstracts of Japan," vol. 012, No. 324 (E–653), Sep. 2, 1988. JP 63 088829 (Matsushita Electric Ind. Co., Ltd.), Apr. 19, 1988.

Unknown, "Patent Abstracts of Japan," vol. 012, No. 009 (E–572), Jan. 12, 1988. JP 62 169442, (NEC Corp.), Jul. 25, 1987.

Unknown, "Patent Abstracts of Japan," vol. 010, No. 259 (E–434), Sep. 4, 1986. JP 61 087353 (Hitachi Ltd.), May 2, 1986.

Unknown, "Patent Abstracts of Japan," vol. 015, No. 408 (E–1123), Oct. 17, 1991. JP 03 169017, (NEC Corp.), Jul. 22, 1991.

Unknown, "Patent Abstracts of Japan," vol. 015, No. 390 (E–1118), Oct. 3, 1991. JP 03 157930 (NEC Corp.), Jul. 5, 1991.

*Primary Examiner*—Charles L. Bowers, Jr.
*Assistant Examiner*—Matthew Whipple
*Attorney, Agent, or Firm*—Hickman Beyer & Weaver

[57] ABSTRACT

A method of fabricating a semiconductor structure utilizing doped silicate glass on a substrate of a wafer. The method includes the step forming a modulation doped silicate glass structure over a first layer of the wafer. The modulation doped silicate glass structure is formed by depositing at least two alternating layers of heavily-doped silicate glass and lightly-doped silicate glass over the first layer. Both the heavily-doped silicate glass and lightly-doped silicate glass layers may comprise glass doped with both a first dopant and a second dopant. The first dopant may represent, for example, phosphorous, and the second dopant may represent, for example, boron.

38 Claims, 7 Drawing Sheets

METHOD FOR FORMING SEMICONDUCTOR STRUCTURE USING MODULATION DOPED SILICATE GLASSES

BACKGROUND OF THE INVENTION

The present invention relates to the manufacture and use of modulation doped silicate glasses (MDSG's) for semiconductor applications. More particularly, the present invention relates to the manufacture and use of modulation doped silicate glasses as the interlayer insulator in semiconductor integrated circuits (IC's).

In the fabrication of semiconductor integrated circuits, homogenous doped silicate glasses, i.e., those having dopants uniformly distributed throughout their silicate glass ($SiO_2$) network, are typically utilized as the insulating material between layers in an IC device, e.g., between the device layer (i.e., the layer in the substrate where the active devices of the IC are formed) and the metal layer that connects to the devices. For this reason, the integrity of the silicate glass insulator structure is crucial for the success of the semiconductor integrated circuit. If there are voids, or small holes, in the silicate glass insulator structure, they can cause problems when subsequent layers are deposited.

By way of example, a type of homogenous doped silicate glass, borophosphosilicate (BPSG), has been long used in the prior art to insulate the IC device layer from the metal layer. BPSG comprises essentially boron oxide and phosphorous oxide in a silicate ($SiO_2$) glass network. In the prior art, homogenous doped silicate glasses, such as BPSG, are formed on a substrate primarily by two methods: thermally activated chemical vapor deposition (CVD) and plasma activated chemical vapor deposition (CVD). In either method, the insulating structure of homogenous doped silicate glass is typically deposited on a substrate at a relatively low deposition temperature, say around 400° C. After deposition, the wafers are then heated to about 800° to 900° C. to anneal the glass. During annealing, the boron oxide and phosphorous oxide mix to stabilize the glass. Further, the elevated temperature of the annealing step permits the homogenous doped silicate glass material to liquify and flow, thereby performing its gap-filling function.

As device geometry shrinks and thermal budgets (i.e., the amount of heat an IC can experience during fabrication without being damaged) for IC fabrication are reduced, the ability of homogenous doped silicate glasses to fill over an uneven surface topology, e.g., the trenches and gaps between gate stacks and interconnects, is also reduced. This is because stable homogenous doped silicate glasses tend to have a fairly high glass transition point, i.e., melting point, and do not flow readily at typical deposition or annealing temperatures to satisfactorily fill the increasingly smaller topological features of modern IC's. This problems can be explained, by way of example, with reference to FIG. 1.

Figure 1:
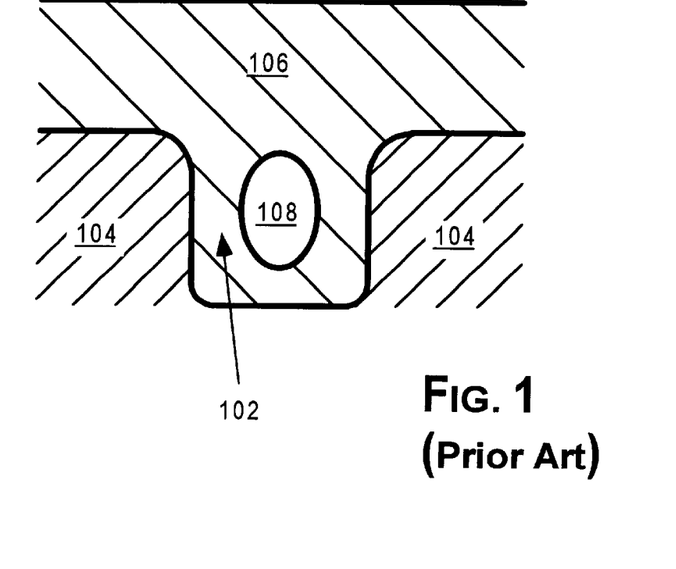
FIG. 1 shows, for illustration purposes, the disadvantages associated with using the prior art homogenous doped silicate glass as the insulating material in IC's that have certain surface topology features and low thermal budgets.

In FIG. 1, there is shown for illustration purposes a trench 102 in surface 104. Surface 104 may represent, for example, the surface of a substrate having devices already formed thereon. For modern processes, trench 102 may, for example, be as narrow as 0.25 microns ($\mu$m). A layer of homogenous doped silicate glass 106, say BPSG, is formed on surface 104, some of which flows into trench 102 during deposition and/or annealing to fill trench 102. In the present example, layer 106 serves as the insulating structure. FIG. 1 further shows a void 108, representing a defect in layer 106. The defect is caused by the inability of the homogenous doped silicate glass material of layer 106 to satisfactorily fill trench 102.

It is known that the melting point of a silicate glass may be decreased by increasing the concentration of dopants in it. Lowering the melting point of the glass improves its ability to flow and fill gaps at a given temperature. As the term is used herein, the term "gap" refers to any generic nonplanar feature on a given surface and may include such features as trenches.

There is, however, a limit on how much dopant can be put into the glass at a given temperature. By way of example, at 750° C., the maximum average concentration of boron oxide and phosphorous oxide that can be put into the silicate glass network without adverse effects is found to be approximately 5.1 weight percent (wt %) of boron and 5.2 wt % of phosphorous, respectively. At higher concentrations, the boron oxide and phosphorous oxide tends to precipitate, resulting in the formation of large crystals of acid, e.g., boric acid and phosphorous acid.

Figure 2:
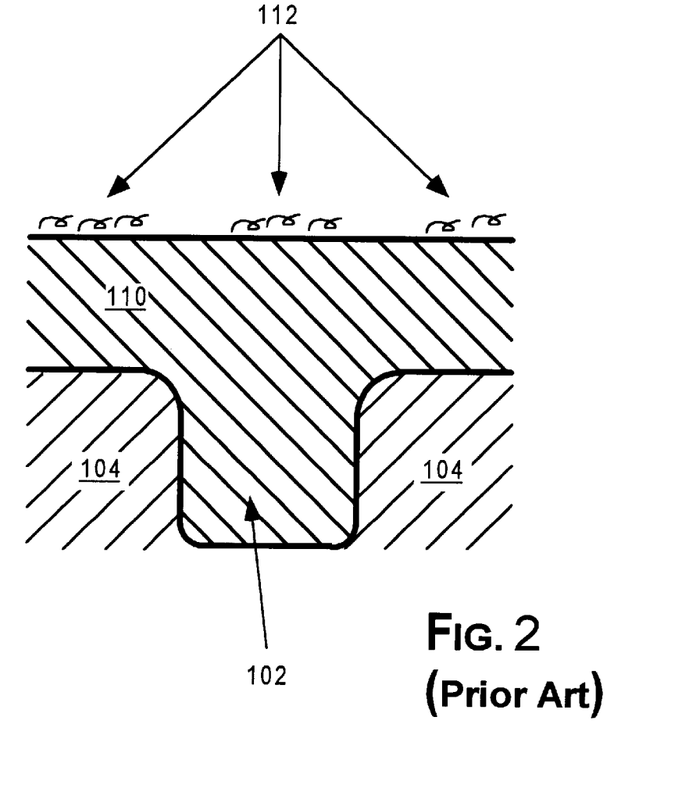
FIG. 2 illustrates the adverse effects of using the prior art uniformly heavily doped silicate glass as the insulating material in the insulator layer of a semiconductor device.

This precipitation condition is shown representatively in FIG. 2 in which a layer of uniformly heavily doped BPSG 110, say one having 10 wt % of boron and 10 wt % of phosphorous, is formed over surface 104. In this case, the heavily doped BPSG of layer 110 satisfactorily fills trench 102 without leaving behind any voids or holes. However, the instability of this uniformly heavily doped BPSG layer 110 causes acid crystals 112 to be formed on its surface. Although acid crystals 112 may be subsequently removed, such removal represents an additional processing step in the fabrication of an IC and is therefore generally undesirable.

More significantly, residues of acid crystals 112 may remain on the surface of layer 110 even after the removal step. The presence of these residues may adversely affect the chemical and electrical characteristics of any layer subsequently deposited over layer 110. For example, if a metallization layer is subsequently deposited on insulating layer 110, the acid residues may corrode the metal lines and increase their resistance, possibly to the point of rendering the device useless.

Uniformly heavily doped silicate glasses also have other problems. For example, if the phosphorous or boron are not completely oxidized due to their excessive concentrations, these materials may react with each other to form borophosphate ($BPO_4$), which is not water-soluble and is difficult to remove.

In view of the foregoing, there is desired an improved insulating material and deposition process therefor that result in a high quality insulator structure. The improved insulating material preferably has superior gap-fill characteristics even when formed with low thermal budgets.

SUMMARY OF THE INVENTION

The present invention relates, in one embodiment, to a method of fabricating a semiconductor structure utilizing doped silicate glass on a substrate of a wafer. The method includes the step forming a modulation doped silicate glass structure over a first layer of the wafer. The modulation doped silicate glass structure is formed by depositing at least two alternating layers of heavily-doped silicate glass and lightly-doped silicate glass over the first layer.

The modulation doped silicate glass structure may be used, for example, as an insulating structure between a device layer and a subsequently deposited metallization layer. In another embodiment, both the heavily-doped silicate glass and lightly-doped silicate glass layers comprise glass doped with both a first dopant and a second dopant. The first dopant may represent, for example, phosphorous, and the second dopant may represent, for example, boron.

In yet another embodiment, the invention relates to a semiconductor structure on a substrate of a wafer, which comprises a modulation doped silicate glass layer disposed above a first layer of the wafer. The modulation doped silicate glass layer comprises at least two alternating layers of heavily-doped silicate glass and lightly-doped silicate glass. When disposed between the device layer of the wafer and a subsequently deposited metallization layer, the modulation doped silicate glass layer may be employed as the insulating layer for the semiconductor structure.

The heavily doped layer provides the superior gap-fill characteristics when disposed over a surface having trenches or gaps while the lightly doped layer renders the entire modulation doped silicate glass layer more stable by keeping the average dopant concentration of the layer low. In this manner, the modulation doped silicate glass layer provides superior gap-fill characteristics without causing the precipitation of potentially harmful acid materials or requiring a high thermal budget.

These and other advantages of the present invention will become apparent upon reading the following detailed descriptions and studying the various figures of the drawings.

BRIEF DESCRIPTION OF THE DRAWINGS

Additional advantages of the invention will become apparent upon reading the following detailed description and upon reference to the drawings, in which.

DETAILED DESCRIPTION OF THE PREFERRED EMBODIMENTS

Those of ordinary skill in the art will realize that the following figures and description of the present invention are illustrative only and not in any way limiting. Other embodiments of the invention will readily suggest themselves to such skilled persons.

FIGS. 1 and 2, discussed above, show the disadvantages associated with using homogenous doped silicate glass as the insulating material in IC's that have certain surface topology features and low thermal budgets.

Referring now to FIGS. 3A–G, shown are cross-sectional views of a simple semiconductor structure, fabricated in accordance with one embodiment of the present invention, including gap 200 in device layer 202 for illustrating the uneven surface topology of device layer 202. In FIGS. 3A–G, a modulation doped silicate glass insulator structure, which comprises layers of doped silicate glass having different dopant concentrations, is being formed over device layer 202 and filling in gap 200. Device layer 202 may represent the layer of the substrate where the active devices are formed for implementing any number of known circuits. However, device layer 202 may also represent any underlying layer whose topological features are insulated or separated from other layers of the IC.

Figure 3A:
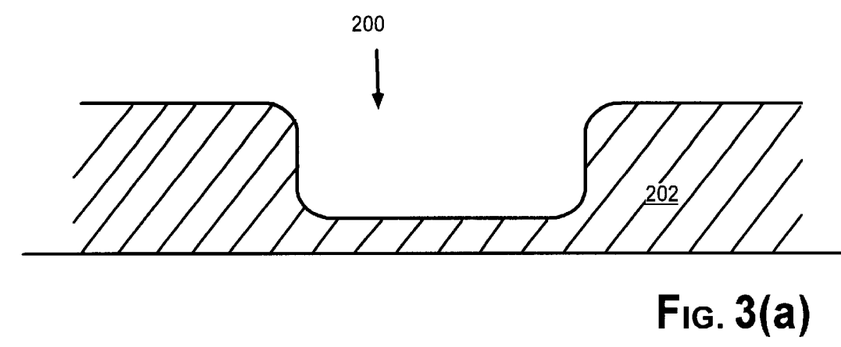
FIGS. 3A–G are cross-sectional views of a simple semiconductor structure, in accordance with one embodiment of the present invention, to illustrate the steps involved in creating the novel modulation doped silicate glass insulator structure.
Figure 3B:
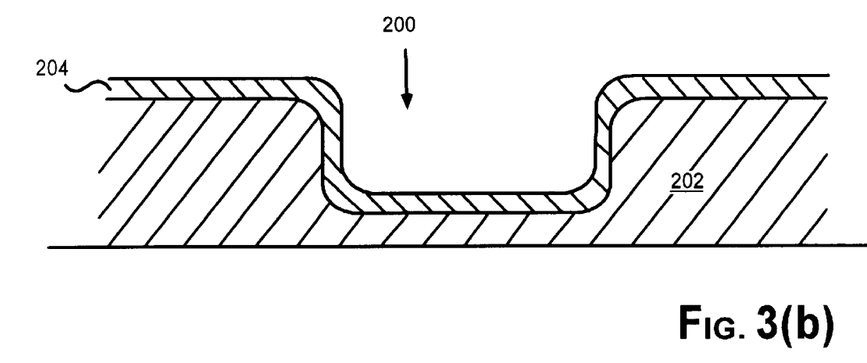

FIG. 3A shows the surface of layer 202 prior to the formation of any insulating structure. In FIG. 3B, a layer of doped silicate glass 204 is deposited over the surface of layer 202. In the present example, it is assumed for simplicity of illustration that the insulating structure is formed directly on the device layer. As is known, however, there may exist other intervening layers depending on the IC being fabricated and the process used for its fabrication. Consequently, as the term is used herein, "over" or "above" does not necessarily indicate a direct contact between the layers under discussion. However, direct contact between the layers is preferable whenever appropriate.

For purposes of explanation, assume that layer 204 is a lightly doped layer of silicate glass although it equally well can be a heavily doped layer. As will be apparent later, it is the structure comprising alternating layers of heavily doped and lightly doped (or undoped) silicate glass that result in the superior gap-fill characteristics of the inventive MDSG. As the terms are used herein, a silicate glass is said to be heavily doped when it has greater dopant concentrations of one or more dopants, than those of lightly doped silicate glass, and the difference in the respective dopant concentrations is such that the melting point of the heavily doped silicate glass is lower than that of the lightly doped silicate glass. Further, although more than one dopant is used in the specific example herein, such is not a requirement.

Because of its low dopant concentrations, layer 204 tends to have a relatively high glass transition point. In fact, at a deposition temperature of between 500° C. to 800° C., the lightly doped borophosphorous silicate glass that results essentially bypasses its liquid phase and condenses directly from its vapor phase to its solid phase by the time the material is deposited onto the surface of layer 202. Since there is no flow, lightly doped layer 204 is essentially conformal, i.e., it follows the contour of the surface topology over which it is formed.

In the context of MDSG using boron and phosphorous as dopant materials, lightly doped silicate glass may have between about 0 wt % to about 4 wt % of boron and between about 0 wt % to about 5 wt % of phosphorous. In contrast, heavily doped silicate glass may have between about 4 wt % to about 7 wt % of boron and between about 4 wt % to about 11 wt % of phosphorous. If more than one dopant is employed, it should be borne in mind that there is a complementary effect between the dopants. As the concentration of one dopant increases, the concentration of the other dopant may be reduced to derive a modulation doped silicate glass material that has substantially the same relevant characteristics.

Figure 3C:
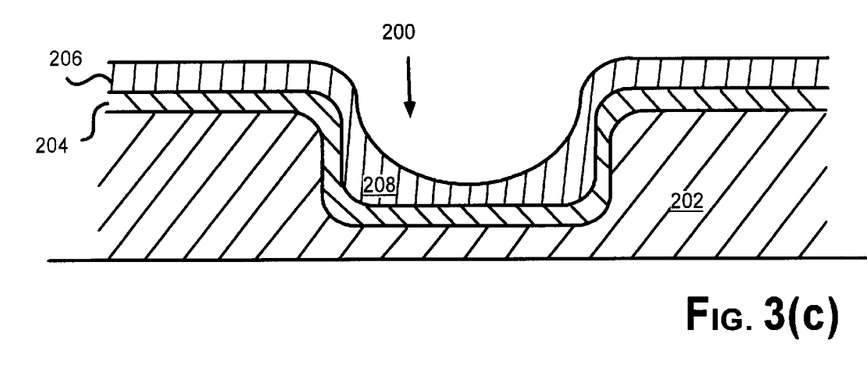

Next, in FIG. 3C, a heavily doped silicate glass layer 206 is formed. Because of its higher dopant concentration, the silicate glass in layer 206 has a lower glass transition point.

This heavily doped silicate glass materials that forms layer 206 is essentially deposited at a deposition temperature that is above its glass transition temperature. Consequently, this heavily doped silicate glass materials readily flows upon being deposited over the surface of layer 204. In contrast with layer 204, layer 206 is non-conformal and equilibrates by flowing to fill in the unevenness in the surface of layer 204. This gap-filling tendency of the heavily doped layer 206 results in a thicker region 208 within gap 200. Thicker region 208, which is a consequence of the migration of the more heavily doped glass material upon deposition, results in the partial filling of gap 200.

Figure 3D:
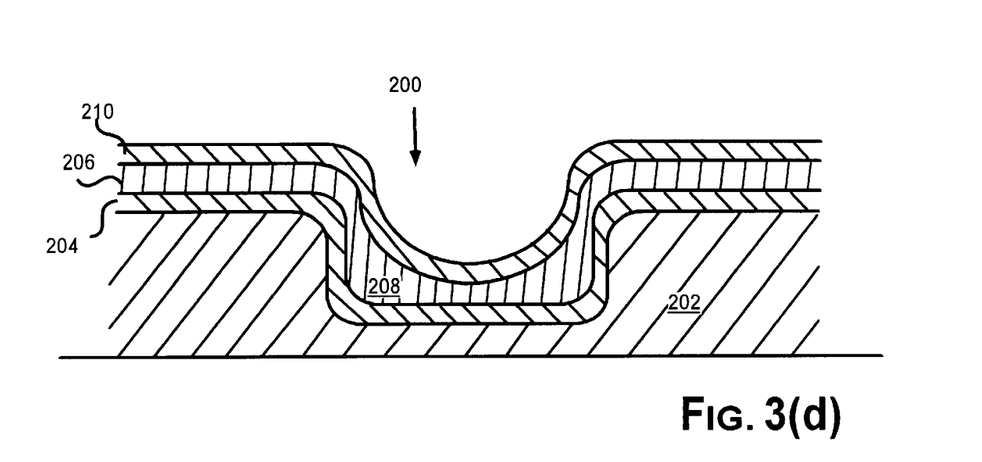

In FIG. 3D, another layer of lightly doped silicate glass 210 is formed over layer 206. As before, this lightly doped layer 210 tends to be conformal and follows the surface irregularities of layer 206. Depending on its glass transition point, relatively little gap-filling is performed by layer 210.

Figure 3E:
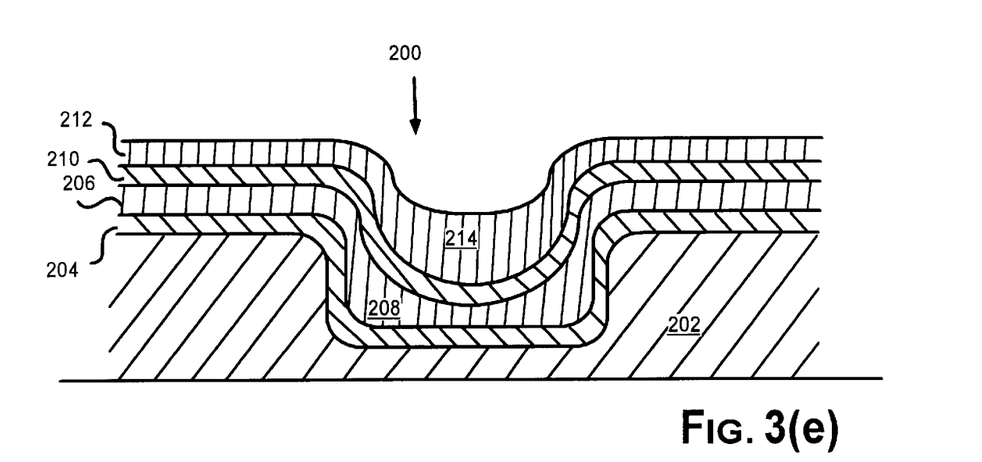

In FIG. 3E, a layer of heavily doped insulating silicate glass is again formed over layer 210. Similar to the heavily doped silicate glass material of layer 206 of FIG. 3C, the heavily doped silicate glass material of layer 212 flows upon being formed to fill in any irregularities of the surface over which it is deposited. Again, this migration of heavily doped silicate glass material results in thicker region 214 within gap 200. Consequently, gap 200 is gradually filled in as is shown in FIG. 3E.

Figure 3F:
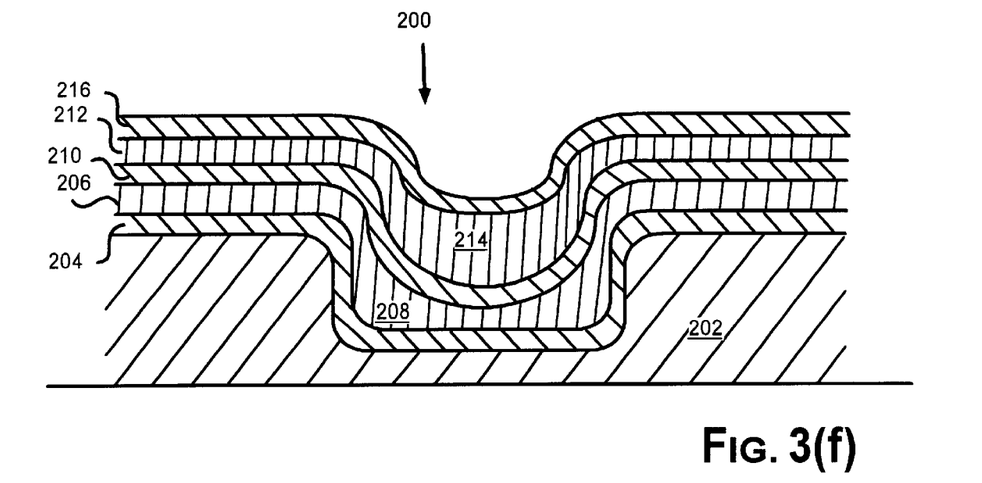

In FIG. 3F, another layer of lightly doped silicate glass 216 is formed over the surface of layer 212. Again, this lightly doped layer tends to be conformal upon being deposited as is shown in FIG. 3F.

Figure 3G:
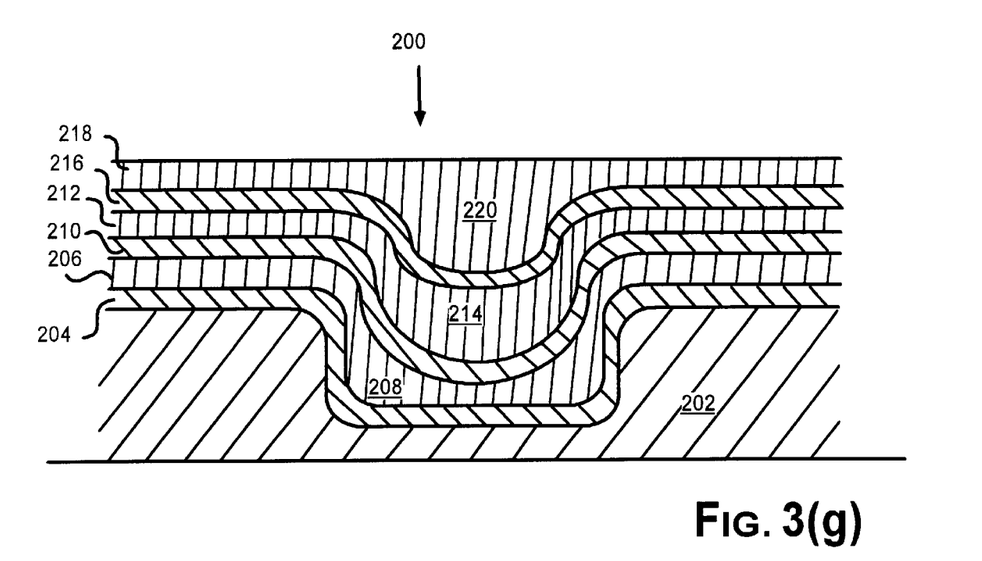

In FIG. 3G, another layer 218 of heavily doped silicate glass is deposited over the surface of layer 216. In this example, this final heavily doped layer freely flows to fill in any remaining unevenness on the surface of layer 216. As a result, the surface of layer 218 is substantially planar. Gap 200 is shown completely filled by the alternate layers of the MDSG structure without leaving behind any void. It should be borne in mind that although the example of FIGS. 3A–3G shows only six alternating layers, a greater or fewer number of alternating layers may be required to achieve satisfactory gap-fill over a specific surface topology.

In one embodiment, if the top layer of the modulation doped silicate glass structure is heavily doped, it may be desirable (but not required) to cap this heavily doped layer with another layer of lightly doped silicate glass or a layer of essentially chemically inert material, e.g., silicate glass with a very low dopant concentration or no dopant. Note that since this last layer does not have to perform the gap-fill function to any significant degree, it is not important that it has a high dopant concentration to lower its melting point and improve its flow. The capping of the insulating structure is a especially useful technique if there is desired an insulating structure that has both superior gap-fill characteristics and very low chemical reactivity with respect to any subsequently deposited layers.

Note that the layers of the insulating structure of FIG. 3G are modulated in their dopant concentration. There exist alternating layers of heavily doped silicate glass and layers of lightly doped silicate glass. As is shown, these layers are interleaved. The heavily doped layers provide the superior gap-fill characteristics while the lightly doped layers render the entire doped silicate glass structure more stable by keeping the average dopant concentration of the structure low. As discussed earlier, if the entire doped silicate glass structure has a uniformly high dopant concentration, say around the dopant concentration of the heavily doped layers of FIGS. 3A–3G, the resulting uniformly heavily doped silicate glass structure may be unstable although a lower melting point and improved gap-fill ability may be achieved thereby.

The modulated layers of silicate glass in the MDSG structure can be formed using a number of deposition processes. In particular chemical vapor deposition (CVD), whether low pressure, thermally activated, plasma activated, or otherwise, is found to be suitable. In accordance with one embodiment, there is invented a novel method for forming the modulated layers of MDSG. In accordance with this embodiment, the modulated silicate glass layers are formed using a low pressure chemical vapor deposition (LPCVD) process, such as obtained utilizing a LPCVD reactor manufactured by Lam Research Corporation of Fremont, Calif. known as the Lam DSM™ 9800.

Figure 4:
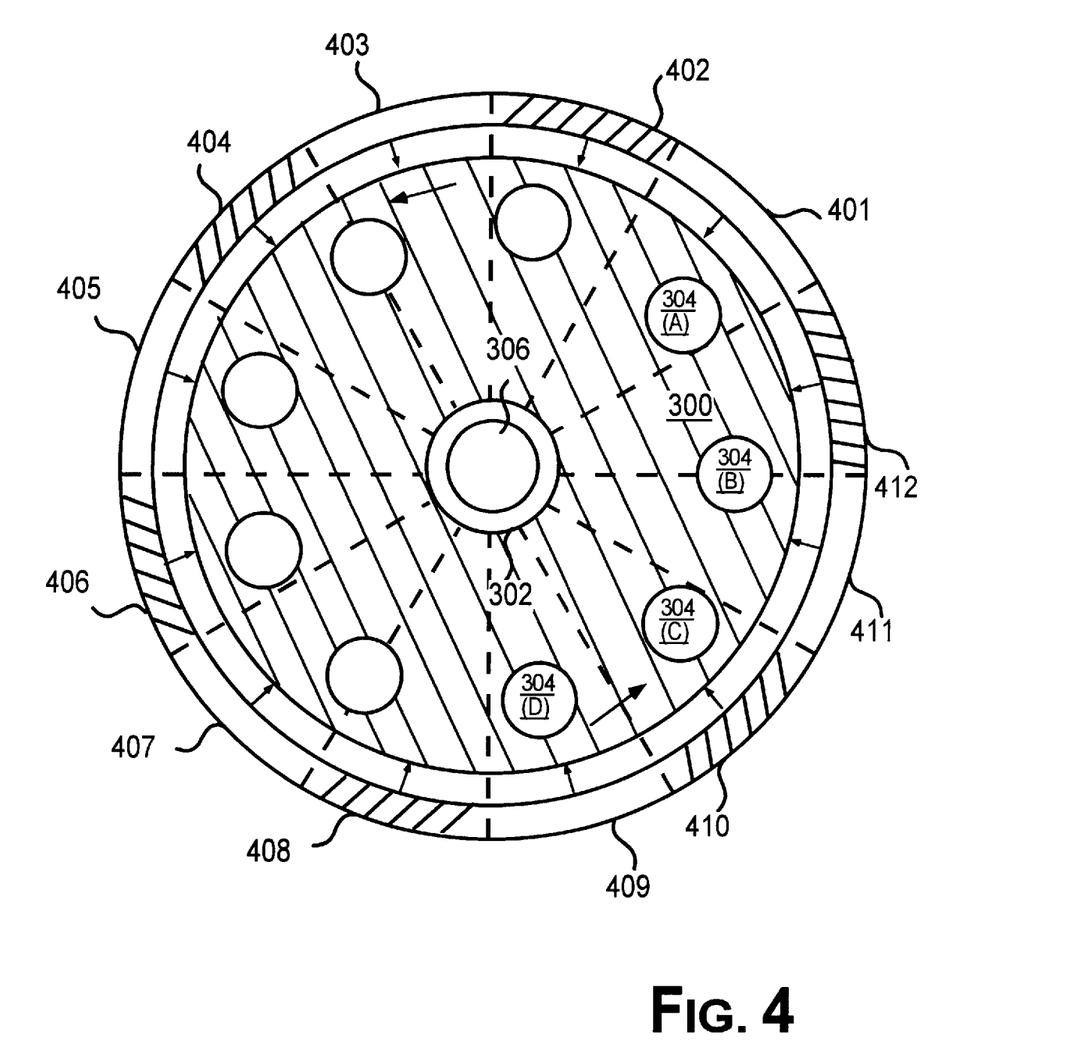
FIG. 4 is a simplified illustration of a low pressure chemical vapor deposition reactor chamber suitable for use in fabricating the novel modulation doped silicate glass insulator structure in accordance with one aspect of the present invention.

To facilitate discussion of this novel deposition method, reference is now made to FIG. 4. In FIG. 4, there is shown a top view of the interior of a LPCVD reactor chamber. It should be noted that the LPCVD reactor shown in FIG. 4 is merely illustrative and variations in reactor design do exist. In the particular example of FIG. 4, a rotating platen 300 rotates counterclockwise around a hub 302 (the direction of rotation of platen 300 is arbitrary). Hub 302 also defines an exhaust port 306, typically formed by an interior passageway through hub 302 for venting gases from the reactor chamber. Platen 300 is designed to hold multiple wafers 304, of which nine are shown. Wafers 304 comprise the substrate forming the device layer and may represent wafers having any diameter, e.g., 8 inches, 200 mm, 300 mm, and others, and may also represent a flat panel substrates.

The reactor shown in FIG. 4 is essentially isothermal. In one embodiment, heaters (not shown for ease of illustration), which may be resistive, are strategically located throughout the reactor chamber to compensate for any heat loss. In this manner, a constant temperature may be maintained during the deposition process. For example, there may exist an inner heater proximate to exhaust port 306 to compensate for the heat loss therethrough. An outer heater surrounding the reactor chamber compensate for the heat loss to the outside world. There is also preferably provided a resistive middle heater, which radiates heat to the entire chamber to maintain a suitable wafer temperature during deposition.

Surrounding the outer periphery of the LPCVD reactor are a plurality of injectors for injecting dopant source materials. In the example of FIG. 4, twelve such injectors, numbered 401–412, are shown in equally spaced apart relationship although fewer or more injectors may be employed. Each injector lining the reactor chamber wall defines a 30 degree injection arc in the reactor chamber, as delineated by the dotted lines. In other words, each injector injects into a different sector of the reactor.

In operation, dopant source materials, typically in gaseous form, are injected from the injectors inward toward exhaust port 306. On their way to exhaust port 306, the dopant source materials flow across the top of the wafers, which are rotatably moved through the injected streams by rotating platen 300. The source materials chemically react to deposit doped silicate glass over the surface of the wafer substrate. After they pass over the surface of the wafers, the source materials and their by-products are exhausted through exhaust port 306 at the center of the reactor chamber.

In accordance with one aspect of the invention, the dopant source materials are injected in alternating injectors. In other words, if there are two dopant source materials, the first dopant source material is injected from a first set injectors while the second dopant source material is injected from a second set of injectors, which are preferably interleaved with respect to injectors in the first set. In this manner, adjacent injectors inject different source materials during deposition. If there were only one dopant involved, the same dopant in varying concentrations, may exist in alternating sectors of the reactor.

Since wafers 304 are located off-center with respect to platen 300, each of them therefore passes through different sectors of the reactor chamber as platen 300 rotates around hub 302. Because adjacent sectors of the reactor chamber contain different dopant source materials, each of wafers 304 experiences alternating concentrations of dopants as it is rotatably moved through the sectors.

In one embodiment, boron- and phosphorous-based MDSG is desired as a final product. In one example, the dopant source material phosphine ($PH_3$) is used as a source for phosphorous oxide and is injected out of six alternating injectors, say, 401, 403, 405, 407, 409, and 411. Triethylborate (TEB) is used as the dopant source material for boron oxide and is injected out of the six intervening injectors, e.g., 402, 404, 406, 408, 410, and 412. Tetraethylorthosilicate (TEOS), which is a liquid at room temperature, may be used as a suitable source for silicone oxide ($SiO_2$).

In one embodiment, the TEOS and TEB may be premixed and injected from the same set of injectors. However, the dopant source materials themselves are not premixed and are still preferably injected from interleaved sets of injectors. By alternating the dopant source materials, e.g., the phosphine and TEB (with or without TEOS), in adjacent injectors, the modulated layers making up MDSG are formed as platen 300 carries wafers 304 from sector to sector. Note that if all the dopant source materials are injected from the same injector, homogenous BPSG and not MDSG would result.

In one embodiment, it is found that a platen rotation rate of about one revolution per minute (one rpm) is found to be suitable for a LPCVD deposition process using the aforementioned Lam DSM™ 9800 equipment. Since the modulation layers that make up the interlayer insulator structure is quite thin, e.g., 150 Angstrom, the time required for depositing such a modulated insulator structure may be around 3–5 minutes.

It should be borne in mind, however, that the use of a circular reactor as well as the circular motion of wafers through sectors having different dopant concentrations is not necessary to the formation of the inventive MDSG structure. It is possible, for example, to employ a linear reactor or to move the wafers in a linear direction through sectors of different dopant concentrations and obtain the same results. The important thing is to expose the wafers to different concentrations of dopants at different times, and there exists many other techniques to achieve such exposure. By way of example, the wafers may remain stationary while the dopant concentrations are changed as a function of time, possibly by moving the sectors themselves over the stationary wafers. As another example, both the wafers and the injectors may be stationary if the dopant sources are injected into and evacuated from a reaction chamber at appropriate times to change the dopant concentration.

One particularly important variable in the formation of the modulated layers making up the MDSG structure is the deposition temperature, e.g., the temperature at which the modulated layers of silicate glass are deposited. It is important that the modulated layers be deposited at a temperature that is sufficiently high to achieve a reasonable control of the chemistry, to obtain a reasonable deposition rate, and to make the material stable. This deposition temperature should also be high enough to permit the layers of heavily doped silicate glass to flow to achieve its gap-fill function upon being deposited. However, the deposition temperature must not be so high as to cause the dopants in the modulated layers to diffuse into each other, thereby destroying the modulated effect.

For example, if deposition occurs at too high a temperature, say over 1,000° C., the boron oxide and the phosphorous oxide in the modulated layers in the example of FIGS. 3A–3G would diffuse into adjacent layers, resulting in a homogenous layer of BPSG instead of the modulated layer structure desired.

Given the foregoing, one would expect to lower the temperature of deposition to reduce the likelihood of inter-diffusion of dopants after the modulated layers are deposited (since dopants diffuse more readily at higher temperatures). In an unanticipated manner, it is discovered that modulation occurs when the deposition temperature is raised above, i.e., higher than, that typically specified for the deposition of homogenous doped silicate glass.

For example, prior art methods of depositing homogenous silicate glass are typically carried out at a deposition temperature of around 400° C. prior to annealing. By contrast, the deposition temperature for forming the modulation doped silicate glass structure is, in one embodiment of the present invention, around 750° C. It has been contemplated that modulation doped silicate glass can be formed at deposition temperatures up to about 800° C., more preferably from about 650° C. to about 800° C., and most preferably at about 750° C.

In fact, the formation of modulated layers of doped silicate glass by depositing silicate glass and dopant materials at a temperature which is higher than typical prior art deposition temperatures for homogenous doped silicate glass formation is counter-intuitive. Although unexpected, the exposure of the substrate to different dopant source materials at different times at the above-mentioned deposition temperature range has the effect of maximizing both dopants in the same spatial regime. The foregoing is unexpected because as the substrate is exposed to an environment rich in one dopant source material but depleted in the other dopant source material (as is the case when the substrate is rotated on the platen from sector to sector of the CVD reactor), one would not expect that both dopants would be maximized in the same layer of glass. Nevertheless, such exposure results in layers in which both dopants are maximized, i.e., heavily doped layers, interleaved with layers which have relatively low dopant concentrations, i.e., lightly doped layers.

In another embodiment, the inventive modulation doped silicate glass insulator structure is formed using a circular, hot-wall low-pressure chemical vapor deposition (LPCVD) reactor known as the Integrity® reactor, which is available from Lam Research Corporation of Fremont, Calif. In this embodiment, the preferred range of pressure within the reactor chamber is between about 2000 mTorr to about 3000 mTorr, and preferably at about 2700 mTorr. However, it is contemplated that a reactor pressure as low as 500 mTorr and as high as 5000 mTorr may be employed. The rotation rate of the platen is set in the range of between about 1 revolution per minute (rpm) to about 5 rpm, and preferably at about 1 rpm. However, it is contemplated that up to 20 rpm may be suitable for deposition given favorable conditions.

For a boron- and phosphorous-based MDSG insulator sample, the following materials are introduced into the reactor chamber. In this example, the injection pattern of the reactants and nitrogen is controlled by the valve sequence of the gas torroid manifold system. The preferable valve configuration is a sequence defining 6 alternating sectors with TEOS, TEB, $O_2$, and $N_2$ and 6 intervening sectors with $PH_3$, $O_2$, and $N_2$.

In one embodiment, TEB is injected at a rate between about 1 ml/minute to about 3 ml/minute, and preferably at about 1.5 ml/minute. It is contemplated that a TEB injection rate from about 0 ml/minute up to about 5 ml/minute may also be suitable.

TEOS is injected at a rate between about 5 ml/minute to about 7 ml/minute, and preferably at about 6.7 ml/minute. It is contemplated that a TEOS injection rate from about 3 ml/minute up to about 8 ml/minute may also be suitable.

A 5% solution of phosphine ($PH_3$) is injected in one embodiment. This phosphine solution is injected at a rate between about 15 sccm to about 35 sccm, and preferably at about 26 sccm. It is contemplated that a phosphine solution injection rate from about 0 sccm up to about 40 sccm may also be suitable.

Nitrogen is injected simultaneously with phosphine (for the purpose of diluting the phosphine to the appropriate concentration) at a rate between 4 slm to about 5.5 slm, and preferably at about 4.8 slm. It is contemplated that a introduction rate from about 0 slm up to about 6 slm may also be suitable.

Nitrogen is also introduced by an additional mass flow controller (for the purpose of controlling the gas velocity and partial pressure of all the reactants) at a rate of about 2 slm to about 4 slm, and preferable at about 3 slm. It is contemplated that an introduction rate from about 0 slm up to about 5 slm may also be suitable.

Oxygen gas is introduced into the reactor chamber at a rate between about 1 slm to about 3 slm, and preferably at about 2 slm. It is contemplated that an introduction rate from about 0 slm up to about 4 slm may also be suitable.

To maintain the proper temperature during the deposition process, the inner heater is set at a temperature range between about 700° C. to about 850° C., and preferably at about 850° C. However, a temperature setting between about 700° C. up to about 900° C. may also be suitable. The middle heater is set at a temperature range between about 700° C. to about 800° C., and preferably at about 770° C. However, a temperature setting between about 500° C. up to about 850° C. may also be suitable. The outer heater is set at a temperature range between about 700° C. to about 850° C., and preferably at about 850° C. However, a temperature setting between about 700° C. up to about 900° C. may also be suitable.

As a further example, the following describes a particular example of MDSG insulator structure formation. It should be borne in mind that the specific values, parameters, and equipments mentioned are merely illustrative and not in any way limiting. In one embodiment, the inventive MDSG insulator structure is synthesized in the aforementioned Integrity® reactor. 200 mm p-type Si substrates are loaded individually from the system load-lock onto a rotating SiC coated graphite platen. For the experiments described herein the rotation rate was set to about 1 rpm.

The platen is heated radiatively by three graphite heaters located below the platen. The reactant gases flow radially across the heated platen from the outer circumference towards the center of the reactor where they are evacuated by the reactor pumping system. Typical system base pressure is about $5 \times 10^{-3}$ Torr and the experiments described herein were carried out at a pressure of about 1 Torr. The reactant gasses are introduced into the reactor via twelve individually controlled and equally spaced injectors located at the outer circumference of the reactor. Each injector, therefore, defines a 30° sector within the reactor.

To form the desired MDSG insulator structure, tetraethylorthosilicate (TEOS) and triethylborate (TEB) are injected through one set of six injectors whereas the other six inlets carry phosphine ($PH_3$). In this way, the chemical environment in each of the twelve 30° sectors is distinctively different from that in the neighboring sectors. The deposition is carried out at about 750° C. with the alternating valve configuration, resulting in a deposition rate for MDSG of around 1.5 nm/second.

Figure 5:
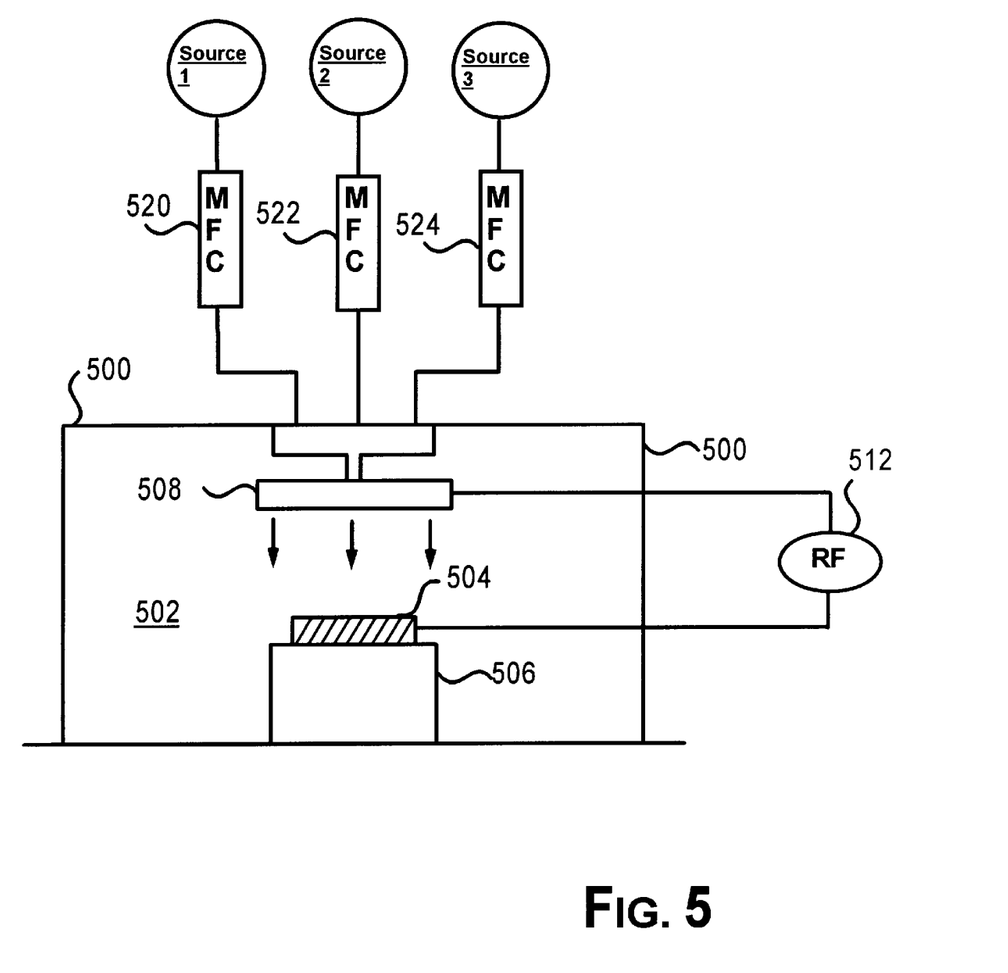
FIG. 5 shows, for illustration purposes, a plasma activated chemical vapor deposition reactor chamber suitable for forming the novel modulation doped silicate glass insulator structure in accordance with one aspect of the present invention.

The inventive modulation doped silicate glass insulator structure of the present invention may also be formed using other types of chemical vapor deposition reactors, e.g., plasma enhanced, thermally activated, and the like. Consequently, the term "chemical vapor deposition" reactor is used herein to refer to the entire class of chemical vapor deposition reactors and not limited to any particular type of reactor. FIG. 5 shows, for illustration purposes, a plasma activated chemical vapor deposition reactor chamber suitable for forming the novel modulation doped silicate glass insulator structure in accordance with one aspect of the present invention. The plasma CVD reactor of FIG. 5 preferably operates at deposition temperatures up to about 800° C., more preferably from about 650° C. to about 800° C., and most preferably at about 750° C. These temperature ranges are typically higher than the temperature ranges used in the deposition of homogenous doped silicate glasses. Referring now to FIG. 5, there is shown a plasma reactor chamber 500 enclosing a chamber interior 502. A wafer 504 containing the substrate where active devices are formed is supported by a chuck 506, which typically rotates during deposition. Above wafer 504, there is suspended a shower head 508 for dispensing the dopant and silicon oxide source materials, e.g., TEB, $PH_3$ or other organophosphorous sources such as triethylphosphate, trimethylphosphate, and the like, and TEOS. A RF circuit 512 biases wafer 504 and shower head 508 to facilitate the creation of plasma in the region between the wafer and the shower head.

A plurality of mass flow controllers 520, 522, and 524 regulate the flow of the dopant and silicon oxide source materials. The mass flow controller regulating each source material is preferably timed with a different frequency so that the dopant source materials are out of phase, i.e., delivered at different times, to produce the modulated layers. In one embodiment, it is contemplated that the silicon oxide source, e.g., TEOS, can be left on at all times during the deposition step. The operation of a plasma enhanced CVD reactor is known in the art and variations in the operation of the plasma enhanced CVD to produce the desired layers should be apparent to those skilled in the art given this disclosure.

Modulation doped silicate glass insulator structures may also be formed using thermally activated chemical vapor deposition processes by appropriately modulating the flow of the source materials using, for example, mass flow controllers. It is contemplated that either the tube-type furnaces or the belt-type furnaces may be utilized for forming the inventive modulation doped silicate glass insulator structures. Given this disclosure, the use of a thermally activated CVD process to form modulation doped silicate glass will be apparent to those skilled in the art.

Figure 6:
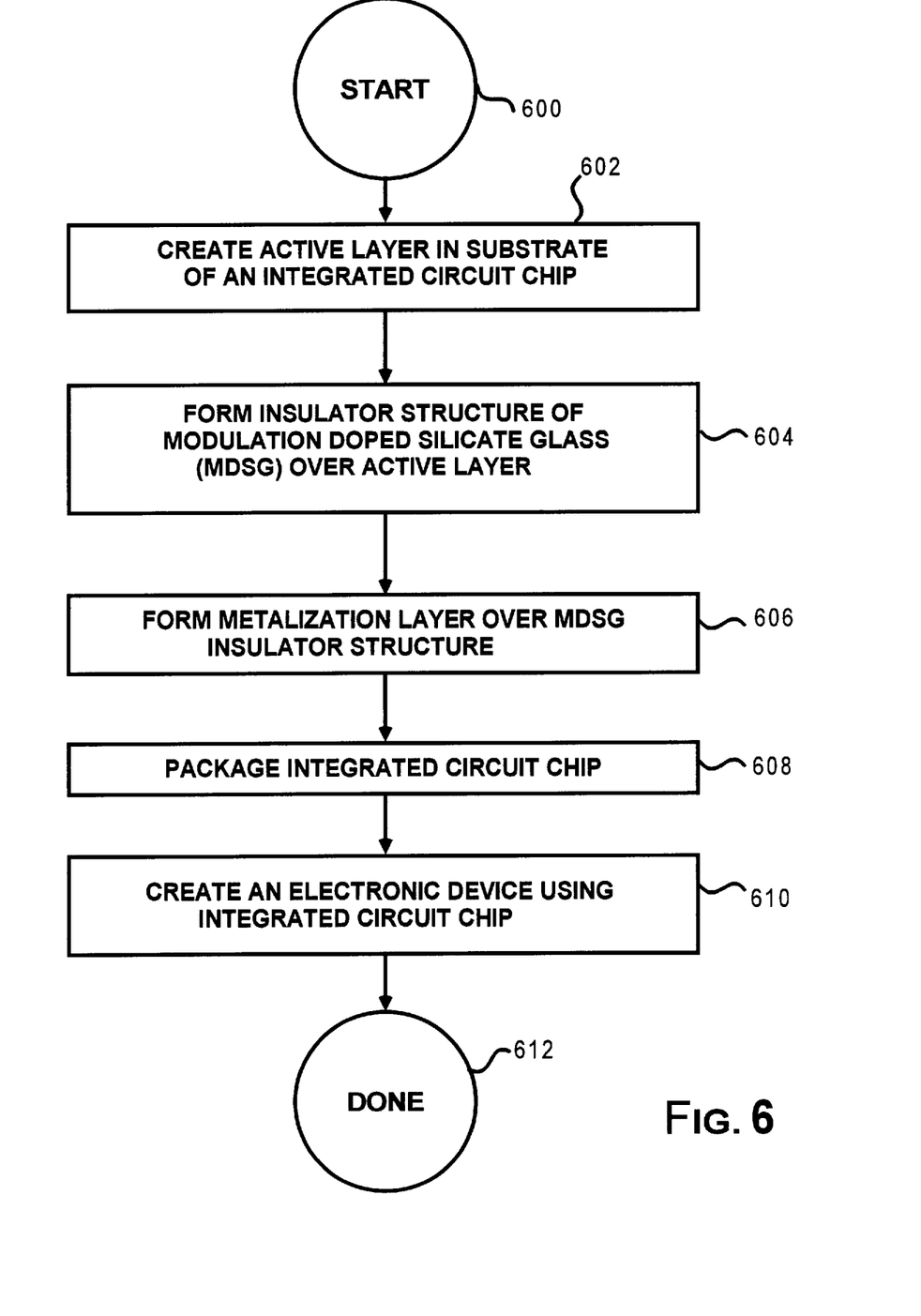
FIG. 6 is a flowchart illustrating, in accordance with one aspect of the present invention, the steps for fabricating an electronic device using an IC that utilizes modulation doped silicate glass as its interlayer insulator.

FIG. 6 is a flowchart illustrating, in accordance with one aspect of the present invention, the steps for fabricating an electronic device using an IC that utilizes modulation doped silicate glass as its interlayer insulator. In step 602, the active devices are formed in the active layer of a wafer substrate. In step 604, a layer of modulation doped silicate glass (MDSG) insulator is formed over the active layer. As mentioned earlier, it is preferred, but not necessary, that the MDSG insulator structure directly contact the active layer.

In the preferred embodiment, boron and phosphorous serve as the dopants although other known dopants, such as arsenic, antimony, or germanium may be utilized if appropriate. Phosphorous dopant source materials include, among others, trimethylphosphite, trimethylphosphate, triethylphosphite, and triethylphosphate. Boron source materials include, among others, trimethylborate. Arsenic source materials include, among others, arsine ($AsH_3$) and germanium source materials include, among others, tetraethoxygermane ($(C_2H_5O)_4Ge$). It should be kept in mind that the above discussion is merely illustrative and not intended to be inclusive. There exist other known alternative dopants and dopant sources, e.g., inorganic hydrides ($SiH_4$, $B_2H_6$, $PH_3$, and the like) or organic sources such as TEB and the like.

In step 606, a metallization layer is formed over the MDSG insulator structure created in step 604. Appropriately patterned, this metallization structure serves, for example, as conductors. If appropriate, the metallization layer may contact the devices utilizing vias formed through the MDSG insulator structure.

In step 608, the resulting circuit chip is packaged for use. In step 610, the packaged IC chip is incorporated in an electronic device, e.g., any number of well known commercial or consumer electronic devices.

It is contemplated that the inventive MDSG materials and deposition processes therefor may be applied to, for example, gate stacks (e.g., DRAMs), trench applications to isolate or fill deep trenches, or micromechanic or micromachine devices such as fuse arrays, and others. The ability of the inventive MDSG insulator structure to fill small gaps of modern IC processes also means that it is well suited to high speed electronic devices. Digital computers represent a class of such high speed electronic devices.

While this invention has been described in terms of several preferred embodiments, there are alterations, permutations, and equivalents which fall within the scope of this invention. It should also be noted that there are may alternative ways of implementing the processes of the present invention. For example, although the MDSG insulating material is particularly suitable in filling small topological features, it may be used over any underlying surface relief or topology. As a further example, it is not absolutely necessary that the silicate glass be doped with more than one dopant to achieve the superior gap-fill property described herein. It is contemplated that a MDSG structure may be formed by doping alternate layers of the structure with alternately heavy and light concentrations of a single dopant. Germaninum oxide, for example, may represent a suitable dopant for such a single dopant MDSG structure. It is further contemplated that such a single dopant MDSG structure may be formed using any of the CVD techniques disclosed herein. It is therefore intended that the following appended claims be interpreted as including all such alterations, permutations, and equivalents as fall within the true spirit and scope of the present invention.

What is claimed is:

1. On a substrate of a wafer, a method for fabricating a semiconductor structure utilizing doped silicate glass, comprising the step of:

forming a modulation doped silicate glass structure over a first layer of said wafer by depositing at least two alternating layers of heavily-doped silicate glass and lightly-doped silicate glass over said first layer, wherein said heavily-doped silicate glass layer and said lightly-doped silicate mass layer are deposited and reflowed substantially simultaneously at a temperature of about 650° C. to about 800° C. and wherein said heavily-doped silicate glass layer and said lightly-doped silicate glass layer of said modulation doped silicate glass structure are permitted to remain in a modulated, non-homogenous state after said semiconductor structure is fabricated.

2. The method of claim 1 wherein said first layer represents a device layer of said wafer.

3. The method of claim 2 wherein said modulation doped silicate glass structure represents an insulating structure between said device layer and a subsequently deposited metallization layer.

4. The method of claim 1 wherein said heavily-doped silicate glass and said lightly-doped silicate glass comprise glass doped with both a first dopant and a second dopant.

5. On a substrate of a wafer, a method for fabricating a semiconductor structure utilizing doped silicate glass, comprising the step of:

forming a modulation doped silicate glass structure over a first layer of said wafer by depositing at least two alternating layers of heavily-doped silicate glass and lightly-doped silicate glass over said first layer, wherein said heavily-doped silicate glass and said lightly-doped silicate glass comprise glass doped with both a first dopant and a second dopant, including:

injecting with a first injector a first dopant source into a first sector of a chemical vapor deposition reactor;

injecting with a second injector a second dopant source into a second sector of said chemical vapor deposition reactor; and depositing said first dopant and said second dopant on said wafer by alternately exposing said wafer to said first sector and to said second sector of said chemical vapor deposition reactor.

6. The method of claim 5 wherein said depositing step comprises the step of linearly moving said wafer through said first sector and said second sector.

7. The method of claim 5 wherein said depositing step comprises the step of moving said wafer through said first sector and said second sector in a circular path.

8. The method of claim 5 wherein said step of forming said modulation doped silicate glass structure further comprises the steps of:

injecting with a third injector said first dopant source into a third sector of a chemical vapor deposition reactor, said third sector being physically located adjacent said second sector and separated from said first sector by said second sector; and injecting with a fourth injector said second dopant source into a fourth sector of said chemical vapor deposition reactor, said fourth sector being physically located adjacent said third sector and separated from said second sector by said third sector, wherein said step of depositing said first dopant and said second dopant on said wafer further comprises the step of moving said wafer through said third sector and said fourth sector.

9. The method of claim 4 wherein said first dopant is phosphorous and said second dopant is boron.

10. The method of claim 9 wherein said heavily-doped silicate glass is at least about 4 weight percent in boron and at least about 7 weight percent in phosphorous, said lightly-doped silicate glass is at most about 4 weight percent in boron and at most about 5 weight percent in phosphorous.

11. The method of claim 10 wherein said first layer represents a device layer of said wafer and said modulation doped silicate glass structure represents an insulating structure between said device layer and a subsequently deposited metallization layer.

12. The method of claim 9 wherein said heavily-doped silicate glass is at least about 4.5 weight percent in boron and at least about 9 weight percent in phosphorous, said lightly-doped silicate glass is at most about 3.5 weight percent in boron and at most about 3.5 weight percent in phosphorous.

13. The method of claim 9 wherein said heavily-doped silicate glass is about 5 weight percent in boron and about 9 weight percent in phosphorous.

14. The method of claim 9 wherein said wherein said depositing step is carried out at a deposition temperature of about 750° C.

15. The method of claim 4 wherein said first dopant and second dopant are selected from the group consisting essentially of boron, phosphorous, arsenic, and germanium.

16. The method of claim 4 wherein said step of forming said modulation doped silicate glass structure is performed in a thermally activated chemical vapor deposition chamber, mass flow controllers in said thermally activated chemical vapor deposition chamber individually controlling as a function of time the flow of a source material for said first dopant and the flow of a source material for said second dopant to create a modulation effect in said alternating layers.

17. The method of claim 4 wherein said step of forming said modulation doped silicate glass structure is performed in a plasma activated chemical vapor deposition chamber, mass flow controllers in said plasma activated chemical vapor deposition chamber individually controlling as a function of time the flow of a source material for said first dopant and the flow of a source material for said second dopant to create a modulation effect in said alternating layers.

18. The method of claim 4 further comprising the step of forming a relatively chemically inert layer above said modulation doped silicate glass structure.

19. The method of claim 1 wherein said depositing step is carried out at a deposition temperature of about 750° C.

20. On a substrate of a wafer, a method for forming a modulation doped silicate glass structure of a semiconductor device, comprising:
   alternately exposing said wafer to a first dopant source and a second dopant source to respectively deposit a first doped silicate glass layer of said modulation doped silicate glass structure and a second doped silicate glass layer of said modulation doped silicate glass structure over said wafer, said first doped silicate glass layer being doped with a first dopant from said first dopant source and having a first dopant concentration level, said second doped silicate glass layer being doped with a second dopant from said second dopant source and having a second dopant concentration level,
   wherein a dopant level of said first dopant in said first doped silicate glass layer is lower than said first dopant concentration level in said second doped silicate glass layer and a dopant level of said second dopant in said first doped silicate glass layer is lower than said second dopant concentration level in said second doped silicate glass layer, said first dopant and said second dopant being maximized in a same spatial regime after said semiconductor device is fabricated.

21. The method of claim 20 wherein said first doped silicate glass layer and said second doped silicate glass layer are deposited at a deposition temperature of about 500° C. to about 850° C.

22. The method of claim 20 wherein said first doped silicate glass layer and said second doped silicate glass layer are deposited at a deposition temperature of about 750° C.

23. The method of claim 20 wherein said first doped silicate glass layer and said second doped silicate glass layer are deposited at a deposition temperature of about 650° C. to about 800° C.

24. The method of claim 20 wherein said modulation doped silicate glass structure represents an insulating structure between a device layer and a subsequently deposited metallization layer.

25. The method of claim 20 wherein said first doped silicate glass and said second doped silicate glass comprise glass doped with both a first dopant and a second dopant.

26. The method of claim 25 wherein said step of alternately exposing said wafer to said first dopant source and said second dopant source comprises the steps of:
   injecting with a first injector said first dopant source into a first sector of a chemical vapor deposition reactor;
   injecting with a second injector said second dopant source into a second sector of said chemical vapor deposition reactor; and
   depositing said first dopant and said second dopant on said wafer by alternately exposing said wafer to said first sector and to said second sector of said chemical vapor deposition reactor.

27. The method of claim 25 wherein said depositing step comprises the step of linearly moving said wafer through said first sector and said second sector.

28. The method of claim 25 wherein said depositing step comprises the step of moving said wafer through said first sector and said second sector in a circular manner.

29. The method of claim 25 wherein said step of alternately exposing said wafer to a first dopant source and a second dopant source further comprises the steps of:
   injecting with a third injector said first dopant source into a third sector of a chemical vapor deposition reactor, said third sector being physically located adjacent said second sector and separated from said first sector by said second sector; and
   injecting with a fourth injector said second dopant source into a fourth sector of said chemical vapor deposition reactor, said fourth sector being physically located adjacent said third sector and separated from said second sector by said third sector, wherein said step of depositing said first dopant and said second dopant on said wafer further comprises the step of moving said wafer through said third sector and said fourth sector.

30. The method of claim 20 wherein said first dopant is phosphorous and said second dopant is boron.

31. The method of claim 30 wherein said first doped silicate glass is at least about 4 weight percent in boron and at least about 7 weight percent in phosphorous, said second doped silicate glass is at most about 4 weight percent in boron and at most about 5 weight percent in phosphorous.

32. The method of claim 31 wherein said modulation doped silicate glass structure represents an insulating structure between a device layer of said wafer and a subsequently deposited metallization layer.

33. The method of claim 30 wherein said first doped-silicate glass is at least about 4.5 weight percent in boron and at least about 9 weight percent in phosphorous, said second doped silicate glass is at most about 3.5 weight percent in boron and at most about 3.5 weight percent in phosphorous.

34. The method of claim 30 wherein said first doped silicate glass is about 5 weight percent in boron and about 9 weight percent in phosphorous.

35. The method of claim 25 wherein said first dopant and second dopant are selected from the group consisting essentially of boron, phosphorous, arsenic, and germanium.

36. The method of claim 25 wherein said step of forming said modulation doped silicate glass structure is performed in a thermally activated chemical vapor deposition chamber, mass flow controllers in said thermally activated chemical vapor deposition chamber individually controlling as a function of time the flow of a source material for said first dopant and the flow of a source material for said second dopant to create a modulation effect in said alternating layers.

37. The method of claim 25 wherein said step of forming said modulation doped silicate glass structure is performed in a plasma activated chemical vapor deposition chamber, mass flow controllers in said plasma activated chemical vapor deposition chamber individually controlling as a function of time the flow of a source material for said first dopant and the flow of a source material for said second dopant to create a modulation effect in said alternating layers.

38. The method of claim 25 further comprising the step of forming a relatively chemically inert layer above said modulation doped silicate glass structure.

\* \* \* \* \*